US006537722B2

(12) United States Patent
Eichhorn et al.

(10) Patent No.: US 6,537,722 B2
(45) Date of Patent: Mar. 25, 2003

(54) INFRARED-IMAGEABLE RECORDING MATERIAL AND OFFSET PRINTING PLATES PRODUCED FROM IT

(75) Inventors: Mathias Eichhorn, Seoul (KR); Karin Maerz, Gross-Gerau (DE); Fritz-Feo Grabley, Koenigstein (DE)

(73) Assignee: Afga-Gevaert AG, Leverkusen (DE)

( * ) Notice: Subject to any disclaimer, the term of this patent is extended or adjusted under 35 U.S.C. 154(b) by 0 days.

(21) Appl. No.: 09/110,819

(22) Filed: Jul. 7, 1998

(65) Prior Publication Data

US 2002/0061460 A1 May 23, 2002

(30) Foreign Application Priority Data

Jul. 8, 1997 (DE) ........................................ 197-29-067

(51) Int. Cl.$^7$ .............................................. G03F 7/039
(52) U.S. Cl. .................... 430/270.1; 430/170; 430/171; 430/176; 430/944; 430/964
(58) Field of Search .............................. 430/270.1, 157, 430/170, 171, 176, 944, 964

(56) References Cited

U.S. PATENT DOCUMENTS

| | | | | | |
|---|---|---|---|---|---|
| 5,248,760 | A | * | 9/1993 | DuBois et al. | 528/353 |
| 5,356,752 | A | * | 10/1994 | Cabrera et al. | 430/270 |
| 5,491,046 | A | | 2/1996 | Deboer et al. | 430/302 |
| 5,576,449 | A | * | 11/1996 | Frank et al. | 549/375 |
| 5,641,608 | A | | 6/1997 | Grunwald et al. | 430/302 |
| 5,654,121 | A | | 8/1997 | Eichhorn et al. | 430/157 |
| 5,731,123 | A | * | 3/1998 | Kawamura et al. | 430/176 |
| 5,840,467 | A | * | 11/1998 | Kitatani et al. | 430/302 |
| 5,879,852 | A | | 3/1999 | Eichhorn et al. | 430/157 |
| 6,017,677 | A | * | 1/2000 | Maemoto et al. | 430/270.1 |
| 6,136,499 | A | * | 10/2000 | Goodall et al. | 430/270.1 |
| 6,165,685 | A | * | 12/2000 | Maerz et al. | 430/273.1 |
| 6,261,738 | B1 | * | 7/2001 | Asakura et al. | 430/270.1 |
| 6,358,665 | B1 | * | 3/2002 | Pawlowski et al. | 430/270.1 |

FOREIGN PATENT DOCUMENTS

| | | | |
|---|---|---|---|
| EP | 0 366 590 | 5/1990 | ........... G03F/7/039 |
| EP | 0 573 805 | 12/1993 | ........... G03F/7/029 |
| EP | 0 625 728 | 11/1994 | ........... G03F/7/004 |
| EP | 0 652 483 | 5/1995 | |
| EP | 0 672 954 | 9/1995 | ........... G03F/7/038 |
| EP | 0 683 435 | 11/1995 | |
| EP | 683 435 A1 | * 11/1995 | |
| EP | 0 704 764 | 1/1996 | ........... G03F/7/029 |
| EP | 0 704 762 | 4/1996 | |
| EP | 0 750 230 | 12/1996 | |
| EP | 0 819 986 | 1/1998 | |
| WO | 90/12342 | 10/1990 | ........... G03C/1/492 |

OTHER PUBLICATIONS

Ege, Seyhan. Organic Chemistry, 2 hu nd Edition. Massachusetts: D.C. Heath and Company, 1989, pp. 24–274.*

Bennett, H., ed. Concise Chemical and Technical Dictionary. New York: Chemical Publishing Co., Inc., 1962, p. 483.*

Frechet et al., "New Approach To Imaging Systems Incorporating Chemical Amplification: Synthesis Ad Preliminary Evaluation Of Novel Resists Based On Tertiary Copolycarbonates", *Journal of Imaging Science*, vol. 30(2):59–64, (1986).

Ito et al., "Chemical Amplification In The Design Of Dry Developing Resist Materials", *Polymer Engineering And Science*, vol. 23(18):1012–1018, (1983).

Ito, "Solid–State Thermolysis of Poly(p–t–Butoxycarbonyloxystyrene) Catalyzed By Polymeric Phenol: Effect Of Phase Separation", *Journal Of Polymer Science*, vol. 24:2971–2980, (1986).

* cited by examiner

*Primary Examiner*—Janet Baxter
*Assistant Examiner*—Barbara Gilliam
(74) *Attorney, Agent, or Firm*—Foley & Lardner

(57) ABSTRACT

A recording material for producing offset printing plates includes: a support having a hydrophilic surface, and an infrared-imageable layer including a) a component which is capable of absorbing infrared radiation and converting the infrared radiation to heat, b) a compound which is capable of releasing acid under the action of the heat generated by component a), and c) a polymeric binder having at least one group which is cleaved by the acid released from the compound b), and at least one hydrophilic group, and wherein the layer becomes soluble in an aqueous-alkaline developer in areas struck by infrared radiation.

17 Claims, No Drawings

INFRARED-IMAGEABLE RECORDING MATERIAL AND OFFSET PRINTING PLATES PRODUCED FROM IT

BACKGROUND OF THE INVENTION

1. Field of the Invention

The invention relates to infrared-imageable recording materials for producing offset printing plates, as well as to processes for producing offset printing plates from the recording material.

2. Description of Related Art

In conventional processes for producing offset printing forms, a film original is placed on a radiation-sensitive layer. The layer is then irradiated through the original with ultraviolet and/or visible light. More recent developments enable laser beams to act on the radiation-sensitive layer under computer control. In this way direct transfer of digital data to an imagewise-irradiated recording material is possible; that is, a film original is no longer required.

Recording materials whose radiation-sensitive layer is sensitized for laser beams with wavelengths in the visible light range generally are known, as disclosed, for example, in EP-A 0 704 764. Lasers which emit in the visible range, however, are relatively expensive. Thus such recording materials have not been widely established.

Infrared lasers, on the other hand, especially laser diodes, are substantially less expensive. However, the use of infrared lasers requires the availability of recording materials which are "thermally imageable", i.e., materials which are sensitized in a wavelength range from about 700 to 1100 nm.

Some thermally imageable materials for producing printing plates are likewise already known. For example, EP-A 0 625 723 discloses a material whose radiation-sensitive layer comprises a mixture of a resol, a novolak, an infrared absorber and a compound which gives a Brönsted acid upon dissociation. The infrared absorbers are typically dyes or pigments which fragment on exposure to radiation, thereby producing an exposure contrast, especially cyanines, merocyanines, indolizines, pyrylium compounds or squarylium compounds. Onium salts, in particular, are often used as acid donor compounds. On irradiation, the infrared absorber and acid former are broken down, as a result of which the irradiated areas become soluble in an aqueous-alkaline developer.

However, the above-described solubility behavior is reversed if the material is heated following irradiation, in which case the Brönsted acid then catalyzes a crosslinking reaction between the resol and the novolak. Under these conditions, it is the irradiated areas of the layer that are insoluble in an aqueous-alkaline developer solution. In this embodiment, therefore, the material is negative-working. EP-A 0 672 954 describes a very similar recording material. Instead of the onium salt, it employs a haloalkyl-substituted s-triazine as acid former.

EP-A 0 652 483 describes a material which is thermally imageable with IR lasers and from which a printing plate is produced without development. The radiation-sensitive layer of this material is hydrophobic in the nonirradiatiated state and accepts offset printing ink. It includes a substance which absorbs infrared radiation and converts it to heat. It also includes a polymer having groups which on exposure to heat and/or acid, are transformed into more hydrophilic and more strongly polar groups. Reactive groups mentioned are tert-alkyl carboxylates, tert-alkyl carbonates, benzyl carboxylates, cyanobenzyl esters, dimethylbenzyl esters and alkoxyalkyl esters (especially tetrahydropyran-2-yl esters). The layer preferably also includes a compound which produces an acid on exposure to heat. In the irradiated areas, the layer accepts an aqueous dampening solution and repels the printing ink. Overall, however, the layer is retained. Printing (hydrophobic) and nonprinting (hydrophilic) areas differ only in their wettability with the dampening solution/ink mixture in the printing press. With a printing plate of this type, however, it is possible only to achieve a very low print run (a few thousand prints). Moreover, the hydrophilic areas of the layer exhibit much poorer acceptance of the dampening solution than an aluminum oxide surface, resulting in a poorer water supply. Since exposed and unexposed (still heat-sensitive) layer areas are present alongside one another, generally it is also not possible to render such a plate more mechanically resistant by baking (which would lead to a higher print run). As IR absorbers, preference is given to those substances which on exposure to IR radiation generate heat and acid. Examples given are aromatic diammonium salts of strong acids. Trihalomethyl-s-triazines are preferred as additional acid donors.

WO 90/12342 describes a thermally imageable material for colorproofing techniques which uses polymeric binders that break down on exposure to heat and/or acid. The expansion of the gaseous breakdown products evolved in the IR-exposed areas of the material leads to an ablation. By transferring the ablated material from an IR-transparent support film to a receiver sheet it is possible to obtain the desired color image. This process, of course, operates without wet development. As IR absorbers preference is given to substances which give off heat and acid under the influence of IR radiation (examples being diammonium salts of strong acids). Also mentioned as an IR absorber is carbon black, whose disadvantage, however, is seen in its usefulness only for black progressives. Binders used are those which are broken down rapidly by acid, preferably at temperatures below 100° C.; for example, nitrocellulose, polycarbonates and certain polyurethanes, and also other binders which can be thermolized to form tertiary carbonium ions with subsequent proton elimination (autocatalysis of the breakdown reaction). As a model of the latter, mention is made of the known thermally and/or acid-catalyzed decomposition of phenols with tert-butyloxycarbonyl groups to form carbon dioxide, isobutene and protons (see also Frèchet et: al., J. Imaging Sci. 30 (2) [1986] 59). The formation of the gaseous decomposition products brings about the ablation of the material on IR irradiation.

Materials which are subjected to wet development following acid-catalyzed thermolysis are disclosed, for example, in EP-A 0 366 590 and in Ito et al., Polym. Eng. Sci. 23 [1983] 1012. They form the basis of highly sensitive photoresists that are sensitized for the UV range. A preferred polymer is poly(tert-butoxycarbonyloxystyrene). A disadvantage of these materials is their low thermal stability, brought about by autocatalytic decomposition with the participation of acidic phenolic hydroxyl groups that are still present in the polymer (see Ito et al., J. Polym. Sci. 24 [1986] 2971). This Ito reference does not disclose or mention the use of these materials in connection with the production of printing plates which place special requirements on polymers in terms both of the developer resistance and in terms of the print run. There is also no disclosure in this Ito reference regarding the sensitization of such materials for radiation in the IR range.

The use of polymers having acid-labile groups as binders for printing plates is described, for example in EP-A 0 683

435. The polymers preferably include monomer units comprising 4-tert-butoxycarbonyloxystyrene (BOCST). Utmost sensitivity for UV/VIS, extremely low removal of material from unexposed areas and very high thermal stability are achieved if the binder includes not only the monomer units (I) having acid-labile groups, e.g., BOCST, but also monomer units (II) having phenolic hydroxyl groups and monomer units (III) having at least one aliphatic hydroxyl group. The content of (II+III) is responsible for good developability in aqueous-alkaline solution. If the content of (II) is too high, the auto-catalytic effect described above reduces the thermal stability of the binder and increases the removal of material from unexposed areas. If some of the monomer units having phenolic hydroxyl groups are replaced by those having aliphatic hydroxyl groups, the thermal stability is improved. The thermal stability is also of particular importance because printing plates produced with this binder, after imaging and before development, require subsequent heating at about 100° C. The best results are obtained when the proportion of (I+III) is from 10 to 80%. The material described, although of excellent stability on storage at elevated temperatures, is nevertheless not thermally imageable, since it does not include any IR absorbers.

SUMMARY OF THE INVENTION

An object of the present invention was therefore to provide a recording material which can be imagewise irradiated with IR radiation sources, especially IR lasers, and subsequently developed to produce plates for conventional offset printing, i.e., wet offset printing. It was further an object to provide offset printing plates, as well as processes for preparing recording materials and offset printing plates.

These other objects are achieved, inter alia, by use of a radiation sensitive layer including an IR absorber, a thermal acid former and a polymeric binder that carries not only acid-labile but also hydrophilic groups. The present invention accordingly provides a recording material suitable for producing offset printing plates comprising: a support having a hydrophilic surface, and an infrared-imageable layer comprising a) a component which is capable of absorbing infrared radiation and converting the infrared radiation to heat; b) a compound which is capable of releasing acid under the action of the heat generated by component a); and c) a polymeric binder including at least one group which is cleaved by the acid released from the compound b), and further including at least one hydrophilic group, and wherein the infrared-imageable layer becomes soluble in an aqueous-alkaline developer in areas struck by infrared radiation. It is believed that imaging is effected as described. However, applicants do not wish to be bound by any theory.

Additional objects, features and advantages of the invention will be set forth in the description which follows, and in part will be obvious from the description, or may be learned by practice of the invention. The objects, features and advantages of the invention may be realized and obtained by means of the instrumentalities and combinations particularly pointed out in the appended claims.

DETAILED DESCRIPTION OF PREFERRED EMBODIMENTS

Any support with a hydrophilic surface can be used in the present recording material. The support with a hydrophilic surface is preferably a mechanically, chemically and/or electrochemically roughened and anodized foil or plate, and can suitably be made from aluminum or an aluminum alloy. The weight of the hydrophilic aluminum oxide layer produced by the anodizing is in general from 0.5 to 5.0 g/m$^2$, preferably from 1.0 to 3.0 g/m$^2$.

The infrared-absorbing component a) is generally capable of absorbing IR radiation and converts it to heat, generally without itself giving off any acid. Preferably, component a) comprises or consists of particles of carbon black. Particularly suitable carbon blacks include lamp, furnace or channel blacks, suitably with an average primary particle size of up to 80 nm. The primary particle size is preferably, however, not more than 60 nm and, with particular preference, not more than 30 nm. The surface area as measured by the widely known method of Brunauer, Emmett and Teller (BET surface area) is preferably at least 30 g/m$^2$.

In a preferred embodiment carbon blacks are employed as component a) that have been subjected to (post)oxidation, producing acidic units on the surface of the carbon black particles. Aqueous dispersions of such carbon blacks preferably exhibit a pH of less than 7, in particular a pH in the range of from 3 to 6.5. Particularly suitable carbon black particles are those that have been dispersed with a polymer beforehand. Prior dispersing can be carried out, for example, using the binder c). Alternatively it is possible to use other binders, particularly those that are soluble in aqueous-alkaline solution, such as phenolic resins (novolaks), polyvinyl acetates, polyvinyl acetals, polyvinyl-pyrrolidones, polyvinyl ethers, poly(hydroxystyrenes) or cellulose derivatives.

The proportion of the IR-absorbing component a) is a result effective amount and preferably is from 1.0 to 30.0% by weight, with particular preference from 5.0 to 10.0% by weight, based in each case on the overall weight of the nonvolatile constituents of the mixture which will form the layer.

Suitable substances that can be used as acid formers b) include those which release a strong acid under the action of the heat generated by the IR absorber a). Preferred acid formers include diazonium, phosphonium, sulfonium, and iodonium salts of strong acids. Particular preference is given to hexafluorophosphates, hexafluoroantimonates and halogenated alkanesulfonates (preferably aromatic or heteroaromatic mono- or bisdiazonium 1,1,2,3,3,3-hexafluoropropanesulfonates). The acidity of the hydrogen chloride that is released in the breakdown of trichloromethyl-s-triazines, on the other hand, is generally not sufficient to cleave the acid-labile group without subsequent heating. Thus, surprisingly these compounds typically should not be utilized as acid donors for the purposes of the present invention.

The proportion of the acid-forming compound b) is an amount effective to give desired results and preferably from 0.1 to 20.0% by weight, with particular preference from 1.0 to 10.0% by weight, based in each case on the overall weight of the nonvolatile constituents of the mixture forming the layer.

The acid-labile group in the polymeric binder c) preferably contains at least one acid-cleavable C—O—C bond. Particularly suitable acid-cleavable groups of this kind include those of the formula —O—CO—OR$^2$ in which R$^2$ is a ($C_3$–$C_{11}$)alkyl, ($C_3$–$C_{11}$)alkenyl or ($C_7$–$C_{11}$)aralkyl radical, preferably a $C_4$-alkyl radical and with particular preference a tert-butyl radical. The acid-cleavable group of the formula —O—CO—OR$^2$ is judiciously attached to a substituted or unsubstituted phenyl or phenylene group located in a main chain or a side chain of the polymer.

The hydrophilic groups of the polymeric binder c) can be any hydrophilic group and preferably comprise phenolic or aliphatic hydroxyl groups, carboxyl, mercapto, sulfonamido or amino groups, with particular preference being given to binders having two types of hydrophilic groups which show a difference in pKa-values of at least 3 units. Especially preferred are phenolic and aliphatic hydroxyl groups. Very particular preference is given to binders c) which comprise phenolic and aliphatic hydroxyl groups at the same time in addition to the acid-cleavable groups. Between phenolic and aliphatic hydroxyl groups there is generally a pKa difference of more than 3.

Suitable aliphatic hydroxyl groups to be used in the polymeric binder c) include hydroxy($C_2$–$C_8$)alkoxy groups or dihydroxy($C_2$–$C_8$)alkoxy groups. In a particularly preferred embodiment the polymeric binder c) is a copolymer including monomer units comprising at least one acid-cleavable C—O—C bond, monomer units comprising at least one aliphatic hydroxyl group, and monomer units comprising at least one phenolic hydroxyl group. Such binders are described, for example, in EP-A 0 683 435, hereby incorporated by reference in its entirety. The proportions of the monomer units having aliphatic and the monomer units having phenolic hydroxyl groups are together preferably at least 65%, based on the sum of all monomer units. The binder c) also may suitably comprise a terpolymer consisting essentially or consisting only of these monomer units.

In one embodiment, the proportion of monomer units having acid-labile groups (groups cleaved by acid) is preferably from 20 to 30%, that of the monomer units having phenolic hydroxyl groups is preferably from 50 to 60%, and that of the monomer units having aliphatic hydroxyl group is preferably from 15 to 25%, based in each case on the overall number of monomer units. The comonomer having aliphatic hydroxyl groups can be, with particular preference, 4-(2,3-dihydroxypropoxy)styrene.

A suitable synthesis of the binders of the invention is described, for example, in EP-A 0 683 435. The copolymer may, however, also feature further monomer units provided they do not impair the developability or other critical aspects of the layer.

The proportion of the polymeric binder c) is preferably from 20 to 80% by weight, more preferably from 30 to 60% by weight, based in each case on the overall weight of the nonvolatile constituents of the mixture forming the layer.

The IR sensitized layer may also optionally include customary additives in customary amounts. To improve the surface texture, for example, a small amount of silicone oil may be added. Further suitable additives include surfactants and the like.

The recording material of the invention can be prepared by any desired method. For example, a suitable recording material can be prepared by coating a support with a dispersion of the thermally sensitized mixture. The liquid phase of the dispersion preferably comprises customary coating solvents, such as tetrahydrofuran, ethylene glycol monomethyl ether, ethylene glycol monomethyl ether acetate, propylene glycol monomethyl ether, propylene glycol monomethyl ether acetate, ethyl lactate or butanone. The constituents dissolved therein (components b) and c)) should generally be soluble in the coating solvent. Drying can then be carried out until the layer is virtually free from solvent. Heating at about 100° C. for one minute is generally sufficient, although the time can be adjusted depending on the application and materials used. Coating can be carried out, for example, by spin coating, casting or the like. The weight of the dried, thermally sensitized layer on the support can be varied as desired and is preferably from about 0.5 to 5 $g/m^2$, more preferably from 1.0 to 3.0 $g/m^2$ and, with particular preference, from 1.8 to 2.5 $g/m^2$.

The present invention also provides a process for producing offset printing plates from the recording material of the invention. The printing plates should generally permit a high print run even without requiring subsequent baking.

Any known process can be used to produce offset printing plates using the instant recording material. In a suitable process, the recording material is first subjected to imagewise irradiation and then developed in an aqueous-alkaline developer, whereupon the irradiated areas of the imageable layer are removed and the hydrophilic surface of the support is exposed. Particularly suitable exposure apparatus comprises customary IR lasers, e.g., diode lasers or Nd-YAG lasers which emit radiation, preferably in a wavelength range from 700 to 1500 nm, more preferably from 700 to 1100 nm. For irradiation, the recording material can be positioned, for example, in a flatbed unit, in an external-drum or in an internal-drum exposure unit.

The aqueous-alkaline developer should generally have a pH of at least 8, more preferably from 10 to 14. As alkaline component it can comprise, in particular, amines (especially ethanolamine), borates, carbonates (especially $Na_2CO_3$), hydroxides (especially NaOH or KOH), silicates (especially ortho- or metasilicates) or phosphates (especially trisodium phosphate). In the case of silicate developers, the proportion of silica to alkali metal oxide is preferably greater than or equal to 1. The use of such a ratio helps to ensure that the aluminum oxide layer of the support is not damaged.

In addition, the developer may comprise buffer substances, complexing agents, defoamers, (organic) solvents, corrosion inhibitors, colorants, surfactants, and/or hydrotropes, as well as other additives or the like.

After development, the printing plate can be clamped directly into a printing press. If this is not to be the case, the plate can be judiciously protected with a gumming solution comprising, for example, synthetic or natural water-soluble (co)polymers, such as polyvinyl alcohol, poly(meth)acrylic acid, poly(meth)acrylamide, polyhydroxyethyl (meth) acrylate, polyvinyl methyl ether, gelatin, dextran, pullulan, cellulose, gum arabic, or alginic acid.

Finally, the present invention also provides the actual printing plate produced from the recording material of the invention.

The invention is described further by the following examples, whose intention is to illustrate the invention but not to restrict it.

The abbreviation "pbw" herein denotes parts by weight. Percentages are by weight unless stated otherwise.

The exposures used in the following examples were made with the aid of an external-drum exposure unit having an effective IR laser output of 130 mW at a wavelength of 1064 nm.

PREPARATION EXAMPLE 1

Preparing the binders having acid-cleavable groups, free phenolic groups and aliphatic hydroxyl groups:

The amounts of starting material employed for the various binders are summarized in Table 1.

General Procedure 2 ml of a 40% strength solution of benzyltrimethyl-ammonium hydroxide (®Triton B) in methanol were added to a solution of poly(4-hydroxystyrene) (Mw=4500 g/mol) (amount: (A) in Tab. 1) in 700 ml of propylene glycol monomethyl ether. Subsequently, the amount of 2,3-epoxy-propanol indicated in Table 1 under (B) was added. This mixture was then refluxed for 7 hours. After it had cooled to room temperature, 0.2 g of 4-dimethylaminopyridine was added. Then, with continual stirring, the amount of di-tert-butyl dicarbonate indicated under (C), as a solution in 100 ml of propylene glycol monomethyl ether, was added dropwise over a period of 30 minutes. After the end of this dropwise addition the reaction was completed by subsequent stirring at room temperature for one hour. The polymer was recovered by pouring the reaction solution into water with vigorous stirring. The polymer was then filtered off and dried in vacuo at 50° C.

TABLE 1

| Polymer | A | B | C |
|---------|---|---|---|
| 1a | 192 g | 16 ml | 105 g |
| 1b | 192 g | 18.7 ml | 87.5 g |
| 1c | 192 g | 16 ml | 70 g |

PREPARATION EXAMPLE 2

For comparison, a binder having acid-labile groups but without hydrophilic groups such as free phenolic groups and without aliphatic hydroxyl groups was prepared:

1.0 g of 4-dimethylaminopyridine was added to a solution of 200 g of poly(4-hydroxystyrene) (Mw=4500 g/mol) in 800 ml of propylene glycol monomethyl ether. Then, with continual stirring, 350 g of di-tert-butyl dicarbonate, as a solution in 400 ml of propylene glycol monomethyl ether, were added dropwise over a period of 60 minutes. After the end of the dropwise addition the reaction was completed by subsequent stirring at room temperature for one hour. The polymer was recovered by pouring the reaction solution, in portions, into water with vigorous stirring, filtering off the polymer and then drying it in vacuo at 50° C.

PREPARATION EXAMPLE 3

Preparing a binder having acid-labile groups and free phenolic groups:

0.4 g of 4-dimethylaminopyridine was added to a solution of 200 g of poly(4-hydroxystyrene) (Mw=4500 g/mol) in 800 ml of propylene glycol monomethyl ether. Then, with continual stirring, 94 g of di-tert-butyl dicarbonate, as a solution in 100 ml of propylene glycol monomethyl ether, were added dropwise over a period of 30 minutes. After the end of the dropwise addition the reaction was completed by subsequent stirring at room temperature for one hour. The polymer was recovered by pouring the reaction solution into water with vigorous stirring, filtering off the polymer and then drying it in vacuo at 50° C.

PRACTICAL EXAMPLE 4

Producing a printing plate with the binders from Preparation Examples 1 to 3

| Mixtures composed of | |
|---|---|
| 6.7 pbw | of binder according to Preparation Examples 1 to 3, |
| 42 pbw | of propylene glycol monomethyl ether, |
| 34 pbw | of tetrahydrofuran, |
| 0.5 pbw | of 4-p-tolylmercapto-2,5-diethoxybenzene-diazonium hexafluorophosphate, |
| 0.01 pbw | of silicone oil and |
| 17 pbw | of carbon black dispersion | were spin-coated onto plates of electrochemically roughened and anodized aluminum and were then dried at 100° C. for 1 minute. The layer weight after drying was from 1.8 to 2.2 g/m².

| The carbon black dispersion consisted of | |
|---|---|
| 10.0 pbw | of carbon black (® Priritex 25), |
| 55.2 pbw | of cresol-xylenol novolak (® Alnovol SPN 400, 45.3% in propylene glycol monomethyl ether acetate), |
| 28.8 pbw | of propylene glycol monomethyl ether and |
| 0.01 pbw | of silicone oil. |

The polymers specified in Examples 1 to 3 could also be employed directly in solution, in other words, without precipitation in water beforehand, to prepare the coating solutions described.

The recording materials prepared in this way were imaged in an external-drum exposure unit with an IR laser of wavelength 1064 nm with an output of 130 mW and with different rotary speeds of the cylinder. Subsequent heating of the irradiated recording materials was not necessary. After imaging, the materials were developed for 1 minute in a developer having the following composition:

| 5.5 pbw | of sodium silicate nonahydrate, |
|---|---|
| 3.4 pbw | of trisodium phosphate dodecahydrate, |
| 0.4 pbw | of monosodium phosphate (anhydrous) and |
| 90.7 pbw | of fully deionized water. |

Table 2 reproduces the exposure results. The parameter used for the sensitivity of the plate is the rotary speed of the cylinder that allowed imaging without fogging. The higher this rotary speed the greater the sensitivity.

TABLE 2

| Binder No. | Rotary speed [rpm] | Notes |
|---|---|---|
| 1a | 100 | |
| 1b | 120 | |
| 1c | 130 | |
| 2 | 50–500 | not developable |
| 3 | 150 | no developer resistance after storage at 25° C. for one week |

When the printing plates with the binders 1a to 1c were used in a conventional offset printing press, print runs of more than 100,000 copies were achieved.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The priority document, German Patent Application No. 197 29 067.1, filed Jul. 8, 1997 is incorporated herein in its entirety by reference.

As used herein and in the following claims, the terms "a", "an" and "the" shall mean the singular or plural of the object which follows unless indicated to the contrary.

What is claimed is:

1. A recording material useful for producing offset printing plates comprising:

a support having a hydrophilic surface; and an infrared-imageable layer on the hydrophilic surface comprising:
 a) a component which is capable of absorbing infrared radiation and converting said infrared radiation to heat,
 b) a compound which is capable of releasing acid under the action of the heat generated by component a), and
 c) a polymeric binder having at least one first group containing a C—O—C bond which is cleaved by acid released from the compound b), and at least one second hydrophilic group different from the first group, and wherein the layer becomes soluble in an aqueous-alkaline developer in areas struck by infrared radiation.

2. A recording material as claimed in claim 1, wherein the hydrophilic group is selected from the group consisting of a phenolic or aliphatic hydroxyl group, carboxyl, mercapto, sulfonamido, and amino group.

3. A recording material as claimed in claim 1, wherein the binder c) comprises both a phenolic hydroxyl group and aliphatic hydroxyl group.

4. A recording material as claimed in claim 3, wherein the aliphatic hydroxyl groups in the polymeric binder c) is a hydroxy-($C_2$–$C_8$)alkoxy group or dihydroxy($C_2$–$C_8$) alkoxy group.

5. A recording material as claimed in claim 1, wherein the infrared-absorbing component a) comprises particles of carbon black.

6. A recording material as claimed in claim 1, wherein the proportion of component a) is from 1.0 to 30.0% by weight based on the weight of the nonvolatile constituents of the layer.

7. A recording material as claimed in claim 1, wherein the compound (b) comprises a diazonium, sulfonium, or iodonium salt.

8. A recording material as claimed in claim 1, wherein the proportion of compound b) is from 0.1 to 20.0% by weight based on the weight of the nonvolatile constituents of the layer.

9. A recording material as claimed in claim 1, wherein the acid-cleavable group is of the formula —O—CO—OR$^2$ in which R$^2$ is a ($C_3$–$C_{11}$)alkyl, ($C_3$–$C_{11}$)alkenyl, or ($C_7$–$C_{11}$) aralkyl radical.

10. A recording material as claimed in claim 9, wherein the acid-cleavable group of the formula —O—CO—OR$^2$ is attached to a substituted or unsubstituted phenyl or phenylene group located in a main chain or a side chain of the polymeric binder.

11. A recording material as claimed in claim 1, wherein the polymeric binder c) comprises a copolymer including monomer units comprising at least one acid-cleavable C—O—C bond, and monomer units comprising at least one aliphatic or phenolic hydroxyl group.

12. A recording material as claimed in claim 11, wherein the proportion of the monomer units having at least one aliphatic or phenolic hydroxyl group is at least 65%, based on the sum of all monomer units in said polymeric binder c).

13. A recording material as claimed in claim 1, wherein the proportion of the polymeric binder c) is from 20 to 80% by weight based on the weight of the nonvolatile constituents of the layer.

14. A recording material as claimed in claim 1, wherein the support is a mechanically, chemically and/or electro-chemically roughened, anodically oxidized aluminum foil or plate.

15. A process for producing an offset printing plate comprising:

subjecting a recording material as claimed in claim 1, to imagewise irradiation with infrared radiation, and then developing the recording material in an aqueous-alkaline developer, whereupon areas of the infrared-imageable layer that were irradiated are removed and the hydrophilic surface of the support is exposed.

16. A process as claimed in claim 15, wherein irradiation is carried out using an infrared laser.

17. An offset printing plate produced by a process as claimed in claim 15.

* * * * *